United States Patent [19]
Saito

[11] Patent Number: 4,583,092
[45] Date of Patent: Apr. 15, 1986

[54] SWEEP CIRCUIT OF KEY MATRIX

[75] Inventor: Tomotaka Saito, Yokohama, Japan

[73] Assignee: Tokyo Shibaura Denki Kabushiki Kaisha, Japan

[21] Appl. No.: 558,477

[22] Filed: Dec. 6, 1983

[30] Foreign Application Priority Data

Dec. 8, 1982 [JP] Japan .................. 57-215017

[51] Int. Cl.⁴ .................. H04Q 9/00; G06F 3/00
[52] U.S. Cl. .................. 340/825.79; 340/365 S; 340/711
[58] Field of Search .................. 340/825.79, 365 S, 711

[56] References Cited
U.S. PATENT DOCUMENTS

| | | | |
|---|---|---|---|
| 3,950,743 | 4/1976 | Hatano et al. | 340/365 S |
| 4,188,626 | 2/1980 | Frantz et al. | 340/365 S |
| 4,398,181 | 8/1983 | Yamamoto | 340/365 S |
| 4,538,146 | 8/1985 | Morris | 340/365 S |

OTHER PUBLICATIONS

Japanese Patent Publication (Kokoku) No. 55-43696, 1978.

*Primary Examiner*—Donald J. Yusko
*Attorney, Agent, or Firm*—Finnegan, Henderson, Farabow, Garrett & Dunner

[57] ABSTRACT

A sweep circuit of a key matrix, has an output circuit wherein a series circuit of a pair of transistors with a terminal interposed therebetween is inserted between a power supply and a reference potential, and a timing pulse for selectively turning on one of said pair of transistors is supplied to the gates of the pair of transistors so as to produce a key scanning signal; an input circuit wherein a transistor is inserted between a terminal connecting an output side of the key matrix and the reference potential, the key matrix being connected between the terminals of the output and input circuits; and a transistor which switches to insert a current limiting resistor between the reference potential and the transistor at the reference potential side in each of the input and output circuits in the non-read-in mode.

8 Claims, 14 Drawing Figures

F I G. 7
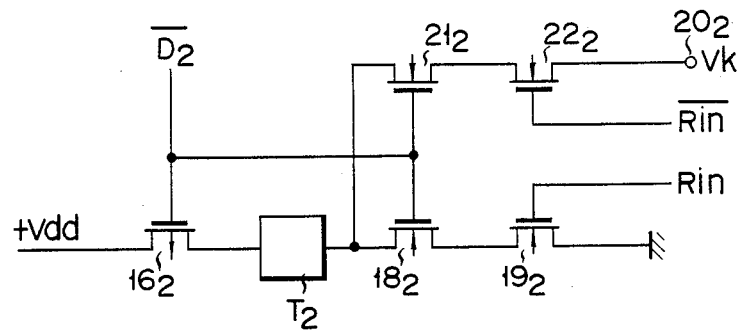
F I G. 8
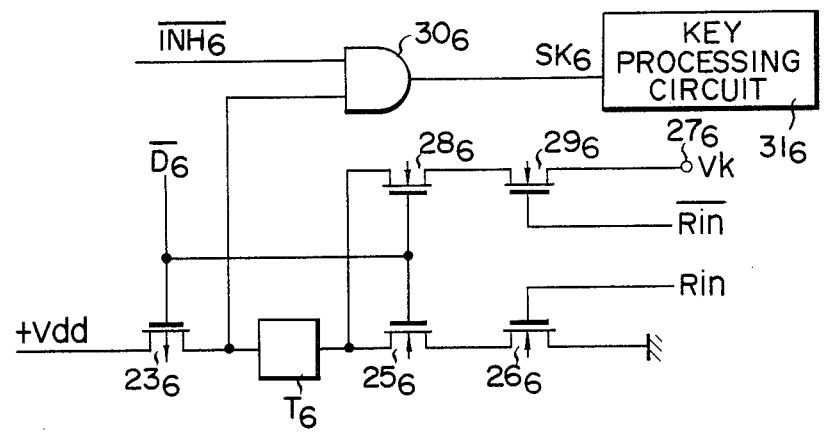
F I G. 9
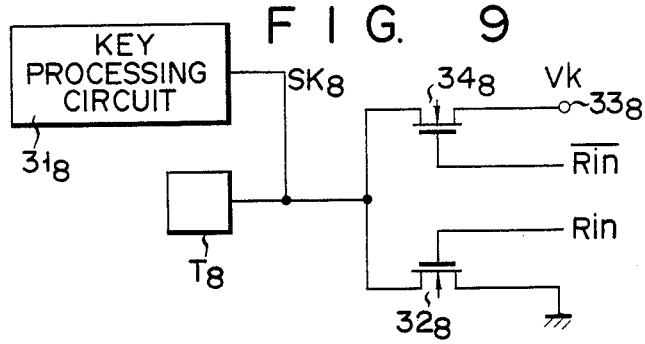
F I G. 10

F I G. 12
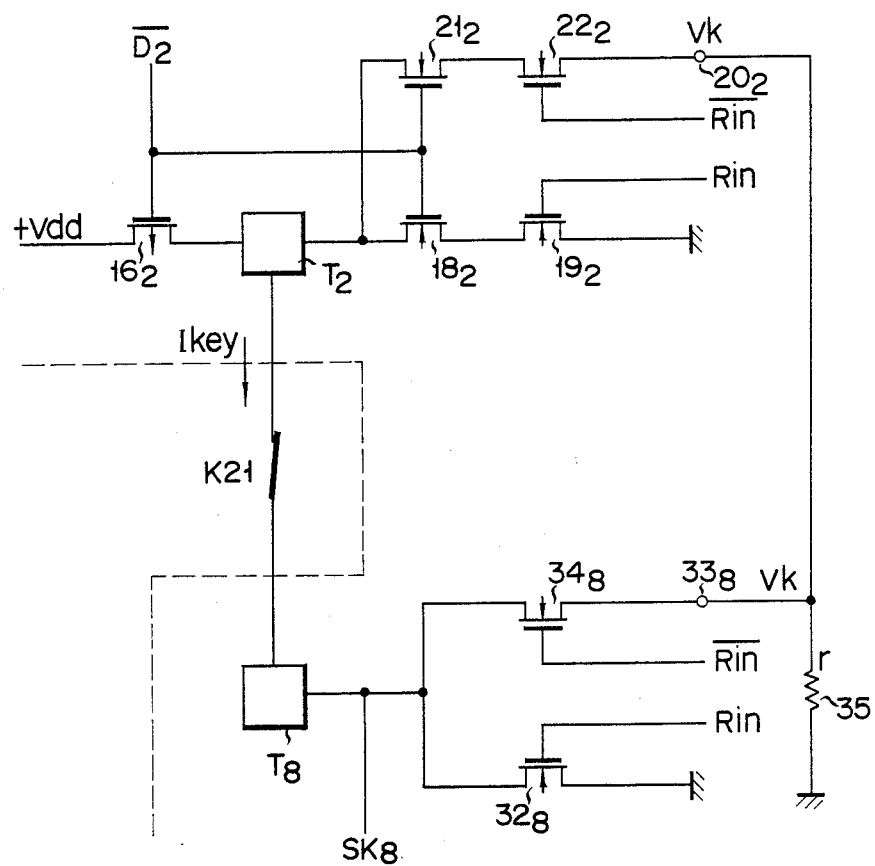

SWEEP CIRCUIT OF KEY MATRIX

BACKGROUND OF THE INVENTION

The present invention relates to a sweep circuit of a key matrix having keys arranged in a matrix form.

Among electronic equipment using LSIs (Large Scale Integrated Circuits), a handheld calculator frequently uses a solar battery cell as a power supply. In an LSI using a solar battery cell as a power supply, the power supply voltage abruptly decreases with an increase in the operating current. Accordingly, power consumption must be as low as possible. In equipment such as a handheld calculator which has operation keys, variations in power consumption upon successive depression of keys present a problem. FIG. 1 is a block diagram showing an example of a hand held calculator using a one-chip LSI having functions of key scanning, arithmetic operations, data entry, and display. Referring to FIG. 1, input and output lines of key scanning of an LSI 1 are connected to a key matrix 2 so as to detect the key operation. A display device 3 comprising a liquid crystal display device receives a digit select signal 4 and a segment select signal 5 for performing dynamic drive. A solar battery cell 6 is connected between power supply terminals Vdd and Vss of the LSI 1. The LSI 1 scans the key matrix 2 so as to detect a depressed key. In order to reduce the number of input and output terminals of key scanning signals, some of the terminals serve both as input and output terminals. In the key matrix 2, a plurality of keys $K_{11}$ to $K_{62}$ are connected in a matrix form. Output terminals $T_1$, $T_2$ and $T_3$, input/output terminals $T_4$, $T_5$ and $T_6$, and input terminals $T_7$ and $T_8$ of the LSI 1 are connected to the key matrix 2. The input/output terminals $T_4$, $T_5$ and $T_6$ are used as input or output terminals by time division. This allows scanning of a larger number of keys with a smaller number of terminals so as to allow ready detection of a depressed key.

The LSI 1 has three output circuits of the same structure which are provided for the output terminals $T_1$, $T_2$ and $T_3$ and output scanning signals through the output terminals $T_1$, $T_2$ and $T_3$. Further, the LSI 1 has three input/output circuits of the same structure which are provided for the input/output terminals $T_4$, $T_5$ and $T_6$, respectively, and receive and output scanning signals through these terminals $T_4$, $T_5$ and $T_6$. Still further, the LSI 1 has two input circuits of the same structure, which receive scanning signals through the input terminals $T_7$ and $T_8$.

Each output circuit, each input/output circuit and each input circuit of the LSI comprising metal insulator semiconductor FETs will now be described with reference to FIGS. 2, 3 and 5.

FIG. 2 shows the output circuit provided for the output terminal $T_2$. In FIG. 2, the elements of this output circuit are designated by numerals with subscript "2" which denotes the output terminal $T_2$. Referring to FIG. 2, the source of a p-channel transistor $7_2$ is connected to a power supply Vdd, and a drain thereof is connected to an output terminals $T_2$. The drain of an n-channel transistor $9_2$ is connected to the output terminals $T_2$, and the source thereof is connected to a reference potential (grounded). The gates of the p- and n-channel transistors $7_2$ and $9_2$ are commonly connected to receive a timing pulse $\overline{D}_2$ and to produce a scanning signal of "H" level on $T_2$ during the "L" level period of the timing pulse $\overline{D}_2$. Nonoverlapping pulses $D_1$, $D_2$ and $D_3$ are supplied from an internal circuit (not shown) to the gates of transistors 7, 9.

FIG. 3 illustrates the input/output circuit provided for the input/output terminals $T_6$. In FIG. 3, the elements of the input/output circuit are designated by numerals with a subscript "6" which denotes the input/output terminal $T_6$. The source of a p-channel transistor $10_6$ is connected to the power supply Vdd, and the drain thereof is connected to a input/output terminal $T_6$. The drain of an n-channel transistor $12_6$ is connected to a input/output terminal $T_6$, and the source thereof is connected to the reference potential. The gates of the p- and n-channel transistors $10_6$ and $12_6$ are commonly connected to receive a timing pulse $\overline{D}_6$. One input terminal of an AND gate $13_6$ is connected to a input/output terminal $T_6$, and the other input terminal receives an inhibit signal $\overline{INH}_6$. The AND gate $13_6$ produces as a detection signal $SK_6$ a signal of a level supplied to a input/output terminal $T_6$ only during the period in which the inhibit signal $\overline{INH}_6$ is at "H" level. Nonoverlapping timing pulses $D_4$, $D_5$ and $D_6$ are supplied from an internal circuit (not shown) to the gates of transistors 10, 12. Similarly, just as the scanning signals are produced from the input/output terminals $T_4$, $T_5$ and $T_6$, inhibit signals $\overline{INH}_4$, $\overline{INH}_5$ and $\overline{INH}_6$ supplied thereto are set at "L" level to inhibit input during scanning cycle.

FIG. 4 shows the input circuit provided for the input terminal $T_8$. In FIG. 4, the elements of this input circuit are designated by numerals with a subscript "8". Referring FIG. 4, the drain of an n-channel transistor $14_8$ is connected to a input terminal $T_8$ to obtain a detection signal $SK_8$, the source thereof is connected to a reference potential, and the gate thereof is connected to a power supply Vdd.

The potentials at the terminals $T_1$ to $T_6$ change as the timing pulses $D_1$ to $D_6$ which do not overlap in a period A of the timing chart shown in FIG. 5.

When the key $K_{23}$ is operated, its contacts close and a circuit between the output terminal $T_2$ and the input/output terminal $T_6$ is formed, as in a period B in FIG. 5. Then, scanning signals corresponding to the timing pulses $D_2$ and $D_6$ are supplied as superimposed to the terminal $T_6$. A detection signal $SK_6$ of the terminal $T_6$ is a signal portion corresponding to the timing pulse $D_2$ and a signal portion corresponding to the timing pulse $D_6$ is inhibited by the inhibit signal $\overline{INH}_6$ and is not supplied to a key processing circuit (not shown) of a later stage connected to the LSI 1. Each schaning cycle starts when timing pulse $D_1$ is output and ends when the next timing pulse $D_1$ is output.

When the input/output circuits connected to the input/output terminals $T_4$, $T_5$ and $T_6$ produce scanning signals, the AND gate 13 is closed. It remains closed during the rest of scanning cycle to inhibit output of detection signals $SK_4$, $SK_5$ and $SK_6$. Therefore, the LSI 1 recognizes the signal corresponding to the timing pulse $D_2$ supplied as the detection signal $SK_6$ and performs processing corresponding to the operation of the key $K_{23}$.

In order to perform this operation, ON resistances R(7) and R(10) of the p-channel transistors 7 and 10 must be set to be sufficiently smaller than those R(9), R(12) and R(14) of the n-channel transistors 9, 12 and 14, and the level of the scanning signal must be changed to draw sufficiently near the voltage of the power supply Vdd. When a key is operated, a DC current path is formed between the short-circuited key terminals. The value of the current flowing in this path is determined by the ON resistances R(9), R(12) and R(14) of the n-channel transistors 9, 12 and 14. Since the n-channel transistors 9, 12 and 14 operate in the saturation range upon depression of a key, the following relation is obtained:

$$R(N) \propto 1/(Vdd - Vth)^2$$

where R(N) is the ON resistance of the n-channel transistor;

Vdd is the power supply voltage; and

Vth is the threshold voltage of the n-channel transistor.

Thus, the value of the current flowing in the above-mentioned path significantly changes in accordance with the threshold voltage Vth of the n-channel transistor. When the value of this current increases due to the decrease of the threshold voltage Vth, the power supply voltage of the LSI 1 is lowered and display is obscured or the like if the power supply is a solar battery cell.

A handheld calculator of this arrangement operates, for example, in accordance with the flow chart shown in FIG. 6. In step 1, a discrimination of "Is key depressed?" is performed. If NO, step 1 is repeated. If YES, the flow advances to step 2. In step 2, operation "Judge type of keys" is performed.

Scanning signals are output from the output terminals $T_1$ to $T_3$ and input/output terminals $T_4$ to $T_6$ during every scanning cycle. Scanning signals are output from the output terminals $T_1$ to $T_3$, and input/output terminals $T_4$ to $T_6$ during every scanning cycle. Every scanning cycle starts when a timing pulse $D_1$ is output. When any key is depressed, the scanning signals are supplied through this key to the input/output terminals $T_4$ to $T_6$ or input terminals $T_7$ and $T_8$. At the same time, detection signals $SK_4$ to $SK_8$ are supplied to a key processing circuit 31. The key processing circuit 31 identifies these detection signals, thus detecting the depressed key, in accordance with the period of time which elaspes after the start of the scanning cycle until the receipt of the detection signals, i.e., in accordance with the phase differences between these signals, on the one hand, and the timing pulse $D_1$, on the other hand. In step 3, "Effect calculation or execute entry data" is performed. In other words, arithmetic operations or data entry are performed in accordance with the type of key discriminated in step 2. When step 3 is completed, a discrimination of "Is key released?" is performed in the next step 4. If the key is released in step 4, the flow returns to step 1 of a routine for waiting for next key to be depressed. If the key is not released in step 4, step 4 is repeated and enters a closed loop for waiting for the depressed key to be released. Since the type of key is discriminated in step 1 or 2 in accordance with the phase of the detection signal $SK_k$ (k=4, 5, ..., 8), the pulse edge of the detection signal $SK_k$ must be sufficiently sharp.

In contrast to this, the release of the depressed key need only be discriminated in step 4. Therefore, the discrimination of step 4 can be performed in accordance with the level of the voltage of the scanning signal supplied to the input terminal. However, in the discrimination routine of step 4, if the key is not released, when the scanning signal scans the depressed key, a feed-through current flows from the power supply Vdd to the reference potential through the shortcircuited key to force a high load current to the power supply 6. Such a feed-through current repeatedly flows upon every scanning until the depressed key is finally released, thus consuming most of the total power consumption.

SUMMARY OF THE INVENTION

It is an object of the present invention to provide a sweep circuit of a key matrix, which operates with a low power consumption and is capable of detecting a depressed key at high speed, and in which the feed-through current flowing upon formation of a short circuit of the depressed key is not dependent on the threshold voltage of a transistor.

According to the present invention, there is provided a key input circuit which reduces a feed-through current in a routine for discriminating the release of a depressed key and is capable of detecting the depressed key at high speed, and in which a feed-through current which flows upon formation of a short circuit of the key is not dependent on the threshold voltage of a transistor.

BRIEF DESCRIPTION OF THE DRAWINGS

FIG. 7 is a view showing an output circuit according to an embodiment of the present invention;

FIG. 8 is a view showing an input/output circuit according to another embodiment of the present invention;

FIG. 9 is a view showing an input circuit according to still another embodiment of the present invention;

FIG. 10 is a circuit diagram for obtaining a potential Vk according to still another embodiment of the present invention;

FIG. 12 is a circuit diagram for explaining the mode of operation of the present invention;

DETAILED DESCRIPTION OF THE PREFERRED ENBODIMENTS

The preferred embodiment of the present invention will be described with reference to a case of an LSI using a complementary metal insulator semiconductor FETs. Since the overall configuration is the same as that of the hand held calculator shown in FIG. 1, a description will be made referring to FIG. 1.

Figure 1:
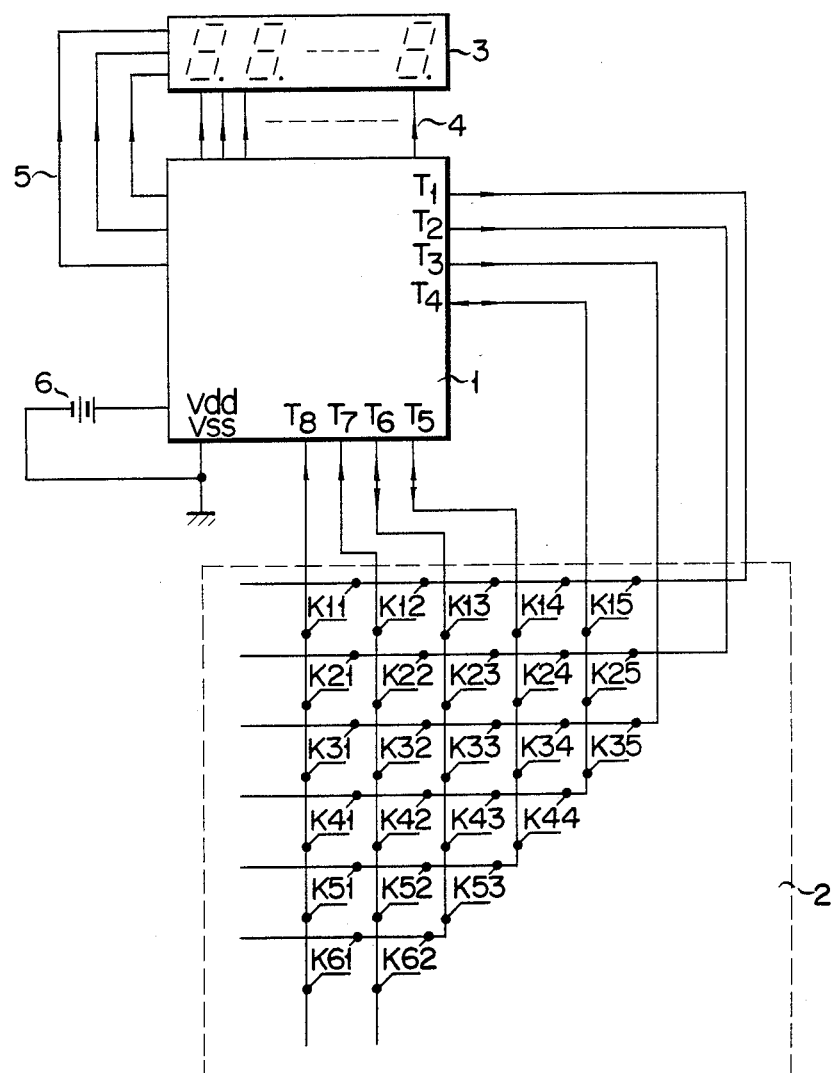
FIG. 1 is a block diagram showing an example of a handheld calculator.

FIG. 7 is a circuit diagram showing an example of an output circuit for producing a sweep signal from an output terminal $T_2$ shown in FIG. 1. FIGS. 7 to 9 are circuit diagrams showing the output circuit, input/output circuit and input circuit which are improvements of the conventional circuits of FIGS. 2, 3 and 4, respectively. FIG. 10 shows a circuit for providing potential Vk. The source of a p-channel transistor $16_2$ is connected to a power supply Vdd, and the drain thereof is connected to a output terminal $T_2$. A series circuit of n-channel transistors $18_2$ and $19_2$ is connected between the output terminal $T_2$ and the reference potential. A series circuit of n-channel transistors $21_2$ and $22_2$ is connected between the output terminal $T_2$ and a Vk supply terminal $20_2$. A timing pulse $\overline{D}_2$ is supplied to the gates of the transistors $16_2$, $18_2$ and $21_2$, a readin signal Rin is supplied to the gate of the transistor $19_2$, and an inverted signal $\overline{\text{Rin}}$ of the read-in signal Rin is supplied to the gate of the transistor $22_2$.

FIG. 8 is a view showing an input/output circuit having input/output terminal $T_6$. The source of a p-channel transistor $23_6$ is connected to the power supply Vdd, and the drain thereof is connected to a input/output terminal $T_6$. A series circuit of n-channel transistors $25_6$ and $26_6$ is connected between the input/output terminal $T_6$ and the reference potential. A series circuit of n-channel transistors $28_6$ and $29_6$ is connected between the input/output terminal $T_6$ and a Vk supply terminal $27_6$. A timing pulse $\overline{D}_6$ is supplied to the gates of the transistors $23_2$, $25_2$ and $28_2$, a read-in signal Rin is supplied to the gate of the transistor $26_6$, and an inverted signal $\overline{\text{Rin}}$ of the read-in signal Rin is supplied to the gate of the transistor $29_6$. One input terminal of an AND gate $30_6$ is connected to input/output terminal $T_6$, and the other input terminal thereof receives an inhibit signal $\overline{\text{INH}}_6$ so as to supply its output to a key processing circuit $31_6$.

FIG. 9 is a circuit diagram of an input circuit which receives signals from the input terminals $T_8$. An n-channel transistor $32_8$ is inserted between a input terminal $T_8$ and the reference potential. Another n-channel transistor $34_8$ is inserted between a Vk supply terminal $33_8$ and the input terminal $T_8$. A detection signal $SK_8$ is obtained from the input terminal $T_8$ and supplied to a key processing circuit $31_8$. And a read-in signal Rin is supplied to the gate of the transistor $32_8$, and an inverted signal $\overline{\text{Rin}}$ of the read-in signal Rin is supplied to the gate of the transistor $34_8$.

One end of a resistor 35 having the other end connected to the reference potential is connected to the Vk supply terminal $20_2$ shown in FIG. 7, the Vk supply terminal $27_6$ shown in FIG. 8, and the Vk supply terminal $33_8$ shown in FIG. 9, as shown in FIG. 10.

Figure 11:
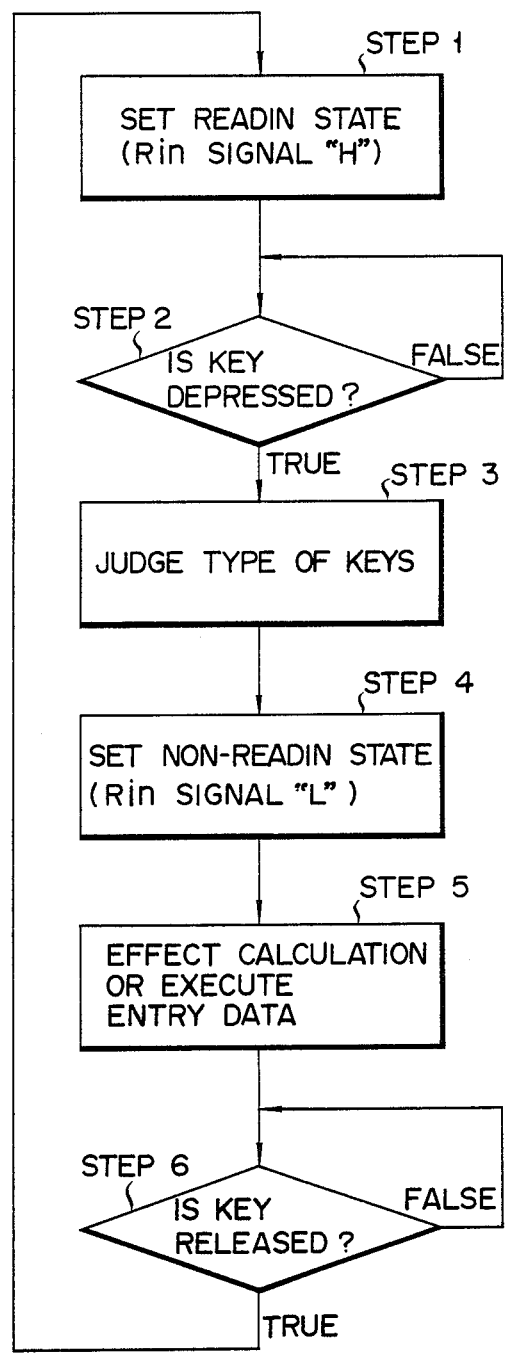
FIG. 11 is a flow chart for explaining the mode of operation of a handheld calculator according to still another embodiment of the present invention.

The handheld calculator as described above operates in accordance with the flow chart shown in FIG. 11. Referring to FIG. 11, in step 1, "Set read-in state" is performed and the read-in signal Rin goes to the high-level. In the read-in state, for example in the output circuit shown in FIG. 7, the n-channel transistor $19_2$ is turned on, and the n-channel transistor $22_2$ is turned off. In the input/output circuit shown in FIG. 8, the n-channel transistor $26_6$ is turned on, and the n-channel transistor $29_6$ is turned off. In the input circuit shown in FIG. 9, the n-channel transistor $32_8$ is turned on, and the n-channel transistor $34_8$ is turned off. In this read-in state, a discrimination of "Is key depressed?" is performed in step 2, a discrimination of the key type is performed in step 3, as in the conventional circuits shown in FIGS. 2, 3 and 4.

In the circuits shown in FIGS. 7 and 8, a series resistance $R(18)+R(19)$ of the ON resistances of the n-channel transistors 18 and 19 is set to be sufficiently greater than the ON resistance $R(16)$ of the p-channel transistor 16. Similarly, a series resistance $R(25)+R(26)$ of the ON resistances of the n-channel transistors 25 and 26 is set to be sufficiently greater than the ON resistance $R(23)$ of the p-channel transistor 23. The p-channel transistors 16, 23 have the same ON resistance $R_p$. The ON resistance of the series circuit comprised of the n-channel transistors 18, 19, i.e., $R(18)+R(19)$, the ON resistance of the series circuit comprised of the n-channel transistors 25, 26, i.e., $R(25)+R(26)$, and the ON resistance of the n-channel transistor 32, i.e., $R(32)$ are of the same value $R_N$. Similarly, the ON resistance of the series circuit comprised of the n-channel transistors 21, 22, i.e., $R(21)+R(22)$, the ON resistance of the series circuit comprised of the n-channel transistors 28, 29, i.e., $R(28)+R(29)$, and the ON resistance of the n-channel transistor 34, i.e., $R(34)$ are of the same value $R_N$. In the next step 4, "Set non-read-in state" is performed and the readin signal Rin goes to the low-level "L" to set the non-read-in state. In this non-read-in state, in the circuits shown in FIGS. 7, 8 and 9, the n-channel transistors 22, 29 and 34 are turned on, and the n-channel transistors 19, 26 and 32 are turned off. Therefore, the potential of L level of the output terminal $T_2$, input/output terminal $T_6$ and input terminal $T_8$ in the output state is supplied by the potential Vk supplied through the resistor 35 shown in FIG. 10. In step 5, "Effect calculation or execute entry data" is performed. A discrimination of "Is key released?" is performed in step 6. In this discrimination routine, since the resistor 35 is inserted between the output terminal $T_2$ and the reference potential, the resistance of the resistor 35 is set to be sufficiently smaller than the series resistance $R(21)+R(22)$ of the ON resistances of the transistors 21 and 22. A DC current I key flows during the periode of each timing pulse $D_2$ while the key $K_{21}$ is depressed as shown in FIG. 12. This current I key is given by:

$$I\text{key} = Vdd/\{R(16) + R(34) + r\}$$
$$= Vdd/\{R_P + R_N + r\}$$

where r is the resistance of the resistor 35. Since the ON resistances $R(16)$, $R(34)$ of the transistors 16 and 34 are sufficiently smaller than the resistance r of the resistor 35, the DC current Ikey may be approximately given by:

$$I\text{key} \approx Vdd/r$$

In other words, the DC current Ikey upon depression of a key is given by Vdd/r and is completely independent of the threshold voltage of the transistor.

A DC current Ikey' upon depression of a key in the read-in state is given by:

$$I\text{key}' = Vdd/\{R(16) + R(32)\}$$
$$= Vdd/\{R_P + R_N\}$$

Since the ON resistance $R(16)$ of the p-channel transistor 16 is sufficiently smaller than the ON resistances $R(32)$ of the n-channel transistors 32, the DC current Ikey' may be approximated by:

$$I\text{key}' \approx Vdd/\{(R(32))\} = Vdd/R_N$$

Figure 2:
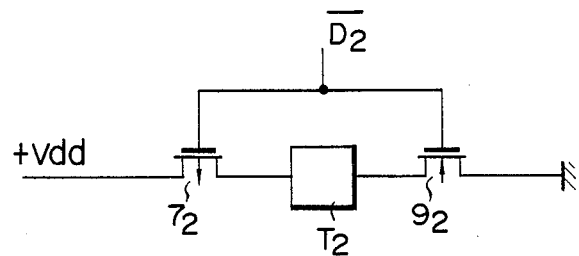
FIG. 2 is a view showing an output circuit for key scanning of a conventional handheld calculator.
Figure 3:
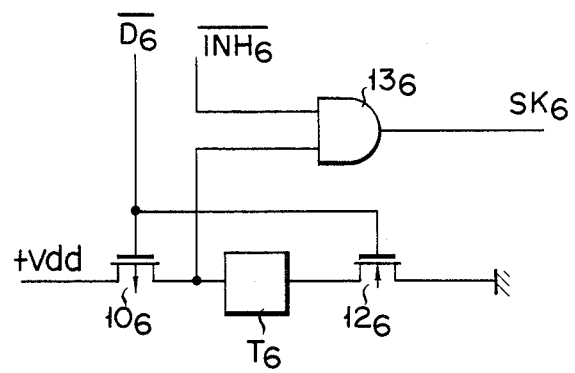
FIG. 3 is a view showing an input/output circuit for performing key scanning of a conventional handheld calculator.
Figure 4:
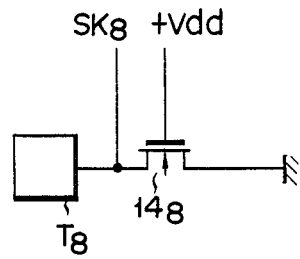
FIG. 4 is a view showing an input circuit for performing key scanning of the conventional handheld calculator.
Figure 5:
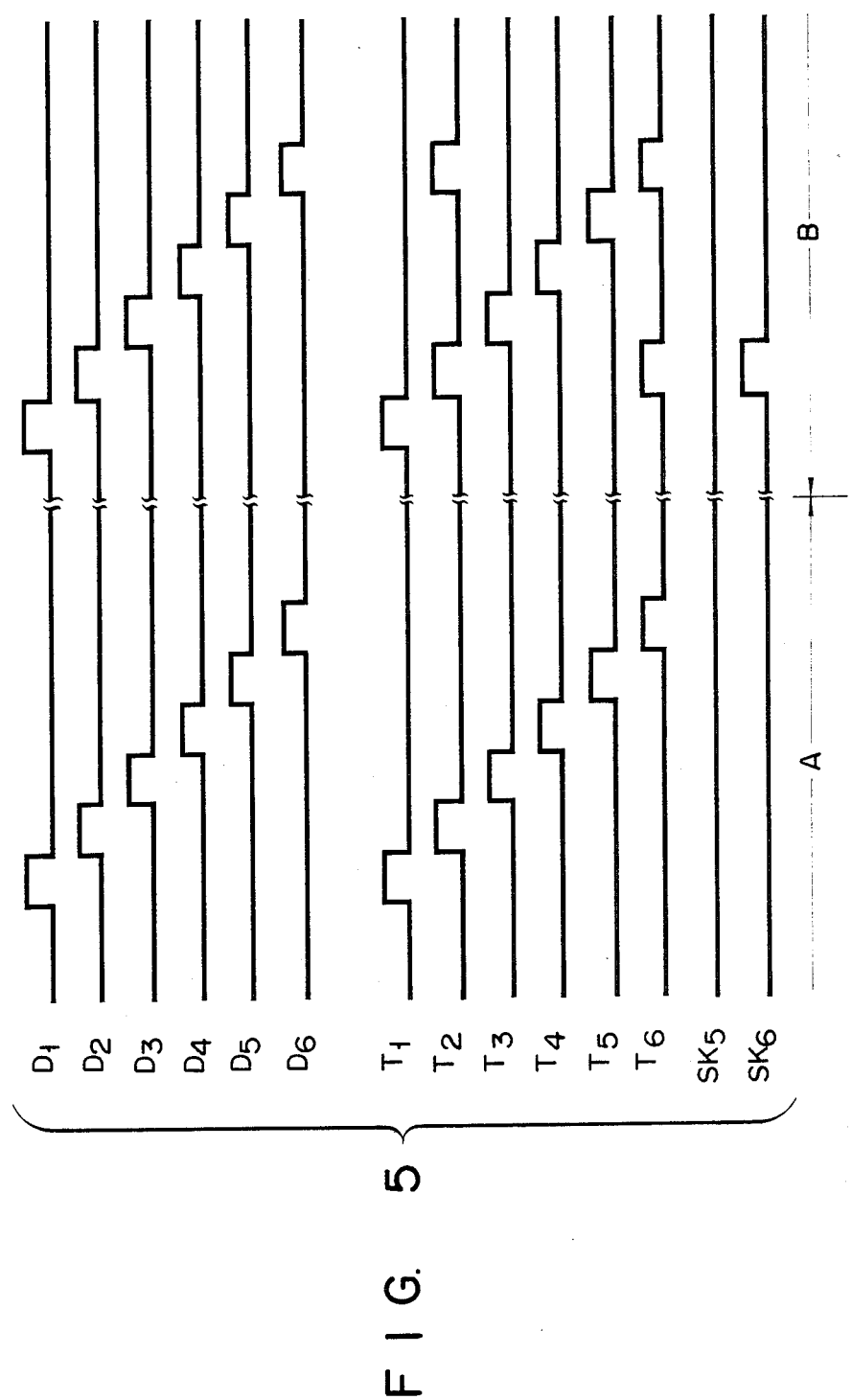
FIG. 5 is a timing chart for explaining the key scanning of the conventional handheld calculator.
Figure 6:
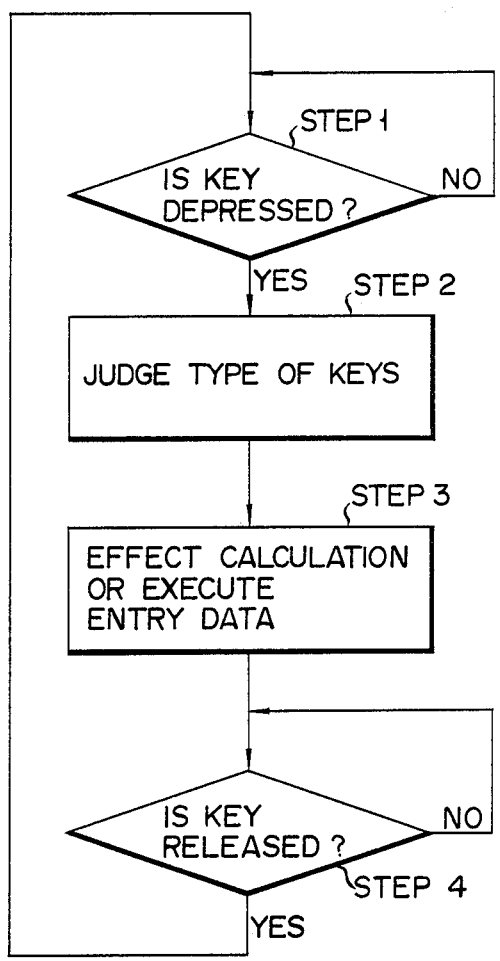
FIG. 6 is a flow chart for explaining the mode of operation of the conventional handheld calculator.

In other words, the DC current Ikey' is a current which flows in the key release discrimination routine in the conventional circuit shown in FIGS. 2, 3 and 4 and is significantly higher than the DC current Ikey in the embodiment shown in FIGS. 7, 8 and 9.

To speed up the key read-in operation, it is necessary to make a key scanning signal rise to the high level and fall to the low level as quickly as possible. For this purpose, the resistance $R_N$ must be reduced. The current Ikey', which flows during the key read-in operation, is far greater than the current Ikey which flows during the non-read-in period. In the embodiment described above, however, this large current Ikey' flows only momentarily when the key is pressed. Once the key has been pressed, the non-read-in state is established and only the small current Ikey flows thereafter. This helps save electric power.

In the flow chart shown in FIG. 11, the level of the potential Vk in steps 5 and 6 is given by:

$$k = (r \cdot Vdd)/\{R_P + R_N + r\}$$

When the key is depressed, the potential Vk is pulled up toward the power supply Vdd. Therefore, a potential closer to the power supply Vdd rather than to the reference potential is supplied to the terminals at the input side. Meanwhile, the potential of the power supply Vdd is supplied as a normal potential. In this state, the signal at the input side is correctly set at "H" level. When the depressed key is released, the potential Vk becomes equal to the reference potential and the signal at the input side is correctly set at "L" level. It is thus determined that no key is depressed and the flow returns to step 2.

It is sufficient to judge "key release" that the scanning signal stays at the "L" level during the non-read-in period. It may fall to the "L" level rather slowly. Hence, the resistor 35 can have a sufficiently great resistance.

When the reference potential is supplied to the output terminals $T_1$ to $T_3$, input/output terminals $T_4$ to $T_6$, and input terminals $T_7$, $T_8$ through the resistor 35 in this manner in the non-read-in state, the DC current which flows upon depression of the key through a resistor having a resistance higher than the ON resistance of the n-channel transistor so that it is significantly reduced and also rendered constant. Thus, the circuit of the present invention achieves a low power consumption and is optimal for key input of an LSI operating on a solar battery cell.

In the circuit shown in FIGS. 7, 8 and 9, complementary metal insulator semiconductor FETs are used. However, single-channel FETs may be used instead. In this case, a depletion-type FET is used at a high output level side, and an enhancement-type FET is used at a low output level side. In the non-read-in state, the reference potential to be supplied to the output, input/output, input terminals $T_1$ to $T_8$ may be supplied thereto through separate resistors.

Figure 13:
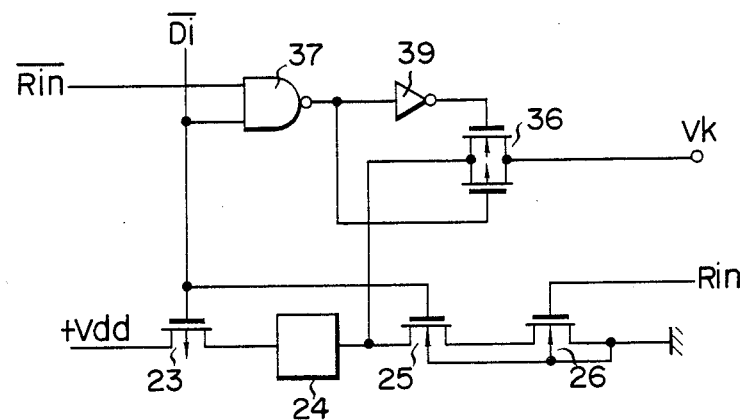
FIG. 13 is a circuit diagram showing an input/output circuit according to still another embodiment of the present invention.
Figure 14:
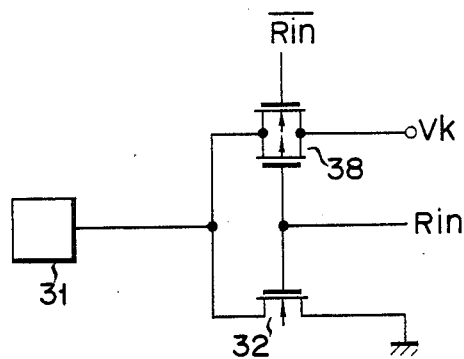
FIG. 14 is a view showing an input circuit according to still another embodiment of the present invention.

Furthermore, as shown in FIGS. 13 and 14, the potential Vk may be supplied to the input/output terminal 24 and input terminal 31 by controlling a transmission gate utilizing a p-channel transistor and an n-channel transistor by means of the non-read-in signal $\overline{Rin}$.

FIG. 13 is a circuit diagram of an input/output circuit. In the input/output circuit shown in FIG. 13, a transmission gate 36 is used in place of the n-channel FETs 28 and 29 shown in FIG. 8. The transmission gate 36 is controlled by ANDing by means of an AND gate 37 and INVERTER 39 a timing pulse $\overline{Di}$ and an inverted signal Rin of the read-in signal e,ovs/Rin/ .

FIG. 14 is a circuit diagram of an input circuit. In the circuit shown in FIG. 9, a transmission gate 38 is used in place of an n-channel FET 34, and the transmission gate 38 is controlled by the read-in signal Rin.

What is claimed is:

1. A sweep circuit of a key matrix, comprising:

an output circuit including a pair of transistors connected in series, thus forming a circuit one end of which is held at a first potential and an output terminal connected to the connecting point of the transistors, said output circuit being adapted to supply a scanning signal from the output terminal to the input of the key matrix by supplying timing pulses to the gates of the transistors, to thereby turn on one of the transistors;

an input circuit for supplying a key processing circuit with data representing the changes of the potential at an input terminal connected to the output of the key matrix; and a switching means for connecting the other end of the output circuit and an input terminal of said input circuit to a second potential during read-in period for identifying any key depressed and connecting the same to the second potential through a means for limiting current during non-read-in period for detecting the release of the key.

2. A sweep circuit according to claim 1, wherein said switching means is a switch for controlling the gates of said field effect transistors.

3. A sweep circuit according to claim 2, wherein said switching means is designed to selectively turn on one of said field effect transistors and said current limiting means is connected to one of the field effect transistors.

4. A sweep circuit according to claim 1, wherein the resistance of a circuit selected by said switching means during the read-in period is lower than that of a circuit selected by said switching means during the non-read-in period.

5. A sweep circuit according to claim 1, wherein said means for limiting current consists of one resistor commonly used for said output and input circuits.

6. A sweep circuit according to claim 1, wherein said means for limiting current comprises a plurality of resistors used for said output and input circuits, respectively.

7. A sweep circuit according to claim 1, further comprising an input/output circuit which functions as an input circuit or an output circuit in accordance with a control signal.

8. A sweep circuit according to claim 1, further comprising:

a transistor connected in parallel to the transistor which forms the other end of said output circuit, thus forming a parallel circuit, one of the transistors of this parallel circuit being held at the second potential through one of the transistors of said switching circuit and the other transistors of this parallel circuit being held at the second potential through the other transistor of said switching circuit and a resistor, so that the transistors of said switching means are turned on and off respectively, by a read-in signal;

an input/output circuit including a pair of transistors connected in series, thus forming a circuit one of which is held at the first potential and an input/output terminal connected to the connecting point of the transistors, said input/output circuit being adapted to supply a scanning signal from the output terminal to the input of the key matrix by supplying a timing pulse to the gates of the transistors, to thereby turn on one of the transistors;

a logic gate having two input terminals, one of which is connected to the input/output terminal of said input/output circuit and the other of which is connected to receive a control signal;

a transistor connected in parallel to the transistor which forms the other end of said input/output circuit, thus forming a parallel circuit, one of the transistors of this parallel circuit being held at the second potential through one of the transistors of said switching circuit and the other transistors of this parallel circuit being held at the second potential through the other transistor of said switching circuit and a resistor, so that the transistors of said switching means are turned on and off, respectively, by a read-in signal;

and wherein the input terminal of said input circuit is held at the second potential through one of the transistors of said switching circuit and through the other transistor of said switching circuit and a resistor, so that the transistors of said switching means are turned on and off, respectively, by a read-in signal.

* * * * *